United States Patent
Akita et al.

(10) Patent No.: US 6,779,733 B2
(45) Date of Patent: Aug. 24, 2004

(54) NONCONTACT ID CARD OR THE LIKE AND METHOD OF MANUFACTURING THE SAME

(75) Inventors: Masanori Akita, Otsu (JP); Koji Ito, Otsu (JP); Toshihiro Mori, Moriyama (JP); Yoshio Nogami, Kuwana (JP); Yoshio Kuramoto, Kuwana (JP)

(73) Assignee: Toray Engineering Company, Limited, Osaka (JP)

( * ) Notice: Subject to any disclaimer, the term of this patent is extended or adjusted under 35 U.S.C. 154(b) by 0 days.

(21) Appl. No.: 10/204,090

(22) PCT Filed: Feb. 21, 2001

(86) PCT No.: PCT/JP01/01253
§ 371 (c)(1),
(2), (4) Date: Aug. 19, 2002

(87) PCT Pub. No.: WO01/62517
PCT Pub. Date: Aug. 30, 2001

(65) Prior Publication Data
US 2003/0029921 A1 Feb. 13, 2003

(30) Foreign Application Priority Data
Feb. 22, 2000 (JP) ........................................ 2000-044006

(51) Int. Cl.[7] .............................................. G06K 19/06
(52) U.S. Cl. ....................................... 235/492; 235/488
(58) Field of Search ................................ 235/492, 487, 235/488, 451; 361/737, 809, 820

(56) References Cited

U.S. PATENT DOCUMENTS

| | | | | | |
|---|---|---|---|---|---|
| 5,852,289 A | * | 12/1998 | Masahiko | .................... | 235/492 |
| 5,880,934 A | * | 3/1999 | Haghiri-Tehrani | .......... | 235/492 |
| 5,969,951 A | * | 10/1999 | Fischer et al. | ............... | 235/492 |
| 6,308,894 B1 | * | 10/2001 | Hirai et al. | .................. | 235/492 |
| 6,374,486 B1 | * | 4/2002 | Brechignac | .................. | 235/488 |
| 6,459,588 B1 | * | 10/2002 | Morizumi et al. | .......... | 361/737 |

FOREIGN PATENT DOCUMENTS

| | | |
|---|---|---|
| JP | H06-120296 | 4/1994 |
| JP | H09-186163 | 7/1997 |
| JP | H09-321391 | 12/1997 |
| JP | H10-050709 | 2/1998 |
| JP | H10-203060 | 8/1998 |
| JP | H10-329462 | 12/1998 |
| JP | H11-034553 | 2/1999 |

* cited by examiner

*Primary Examiner*—Daniel St.Cyr
(74) *Attorney, Agent, or Firm*—Rader, Fishman & Grauer PLLC (57) ABSTRACT

This noncontact ID card or the like comprises an antenna circuit board having an antenna formed on a substrate and an interposer board having expanded electrodes formed on a substrate where an IC chip is embedded, the expanded electrodes being connected to electrodes of the IC chip, wherein both boards are stacked in such a way that the electrodes of the antenna are joined to the expanded electrodes.

26 Claims, 9 Drawing Sheets

FIG. 17 PRIOR ART

NONCONTACT ID CARD OR THE LIKE AND METHOD OF MANUFACTURING THE SAME

BACKGROUND OF THE INVENTION

1. Technical Field of the Invention

The present invention concerns a noncontact ID (identification information) card or the like and a manufacturing method of the same.

2. Related Art

Conventionally, the classification information is obtained by many types of bar codes printed or adhered on a card type paper, for instance, such as a tag attached to a merchandise and such bar codes, being simple printing to the paper, presents a high productivity and a low cost.

On the other hand, the IC (integrated circuit) chip, different from the bar code, not only indicates information, but also increases the quantity of information by leaps and bounds and, at the same time, permits to rewrite the information. Moreover, the IC chip is being increased in the productivity and reduced in the price. Therefore, a so-called noncontact ID card, noncontact tag or the like packaging IC chips on an antenna circuit board (such things shall be called collectively noncontact ID card or the like, hereinafter.) comes to be used.

As it is well known, the noncontact ID card or the like hides a broad applicability for ID recognition, electronic settlement, or others, because they can read and write simultaneously a quantity of information and, what is more, assure a high security. Consequently, their wider use can be accelerated by leaps and bounds, provided that their manufacturing cost is reduced.

Figure 16:
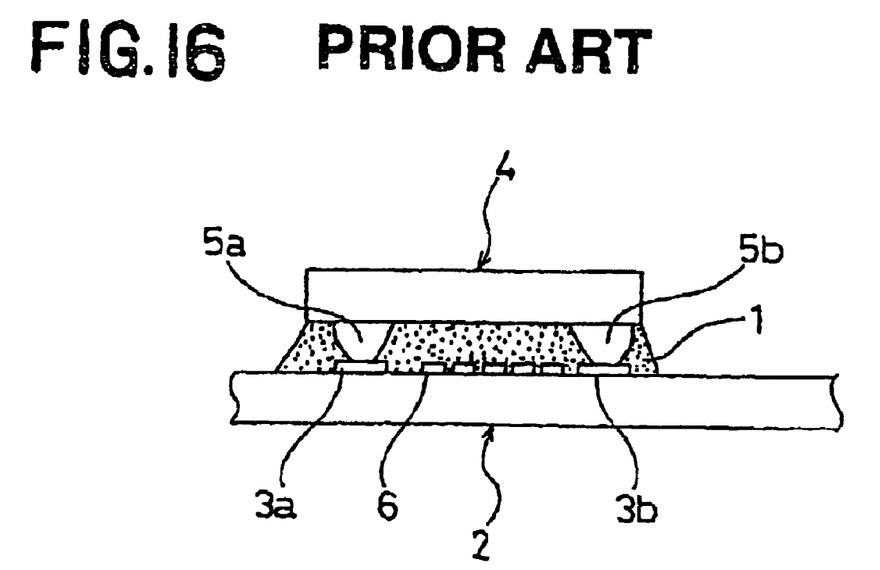

However, the noncontact ID card or the like are manufactured, in general, by heat pressing antenna electrodes 3a, 3b of an antenna circuit board 2 to which an anisotropic conductive film (ACF) 1 and bumps 5a, 5b of the IC chip 4 in a precisely registered state, in short, by bonding the both, as shown in FIG. 16.

As a result, a high accuracy bonder installation is required, and there was a problem of high manufacturing cost (mainly packaging cost). What is more, it is extremely difficult to prevent the increase of manufacturing cost, because the productivity lowers though the bonding installation price tends to rise a degree as a more accurate packaging technology is required, according to a further size reduction and miniaturization of the IC chip 4.

It should be appreciated that the bumps 5a, 5b of the IC chip 4 are bonded by heat pressing to the antenna electrodes 3a, 3b of the antenna circuit board 2 in a manner to straddle an antenna 6 connected to them; however, the antenna 6 is formed into a plurality of turns as, for instance, 6 turns or others (refer to FIG. 17), and defines the antenna electrodes 3a, 3b at both ends thereof. Consequently, the line width of the antenna 6 should be miniaturized following the size reduction and miniaturization of the IC chip 4, and a high precision antenna forming technology is required; so it was difficult to prevent the increase of manufacturing cost, also from this point.

It is a first object of the present invention to provide a noncontact ID card or the like allowing to project the prevention of increase of manufacturing cost (mainly packaging cost) of noncontact ID card or the like, by permitting to register easily the electrode of the chip and the antenna electrode of the antenna circuit board, even if the IC chip is reduced in size and miniaturized, and a manufacturing method of the same.

Also, it is a second object thereof to provide a noncontact ID card or the like allowing to keep the electric bonding state of the electrode of the IC chip and the antenna electrode of the antenna circuit board satisfactory (keep in the conductive state) in addition to the insulation of the predetermined points, even for the noncontact ID card or the like of the laminated structure of the antenna circuit board and interposer board and a manufacturing method of the same.

SUMMARY OF THE INVENTION

In order to achieve the aforementioned objects, the noncontact ID card or the like of the present invention comprises an antenna circuit board with an antenna formed on a substrate, and an interposer board with an expanded electrode formed on a substrate where an IC chip is embedded, the expanded electrode being connected to an electrode of the IC chip, wherein both boards are laminated in a manner to bond the electrode of the antenna and the expanded electrode.

As both boards are laminated in a manner to bond the electrode of the IC chip and the antenna electrode through the expanded electrode in this way, both electrodes can be registered easily each other despite the IC chip size reduction and miniaturization and, consequently, the increase of manufacturing cost (mainly packaging cost) of noncontact ID card or the like can be prevented.

In the present invention, for bonding the antenna electrode and the expanded electrode, the antenna electrode and the expanded electrode may be bonded by an electric conductive adhesive agent, or the antenna electrode and the expanded electrode may be bonded directly, by gluing the substrate of the antenna circuit board and the substrate of the interposer board.

Also, an insulating adhesive agent is preferably disposed between the substrate of the antenna circuit board and the substrate of the interposer board, in a way to seal an antenna formation portion of the antenna circuit board and an electrode formation portion of the IC chip. Further, the IC chip electrode may have advantageously an under barrier metal layer.

The insulation of predetermined points and the bonding of both boards can be reinforced by charging insulating adhesive agent between the antenna circuit board and the interposer board, and the electric bonding state of the electrode of the IC chip and the antenna electrode of the antenna circuit board can be kept satisfactory (kept in the conductive state), by forming the under barrier metal layer (UBM layer) on the IC chip electrode. It should be appreciated that the substrate of the interposer board and the substrate of the antenna circuit board may be composed of a resin film.

On the other hand, the manufacturing method of the noncontact ID card or the like of the present invention comprises steps of electrode formation for forming an expanded electrode on a substrate of an interposer board where an IC chip is embedded, the expanded electrode being connected to an electrode of the IC chip, and board lamination for laminating the interposer board and an antenna circuit board in a way to bond an antenna electrode formed on a substrate of the antenna circuit board and the expanded electrode.

Thus, as the expanded electrode is formed on the substrate of the interposer board where the IC chip is embedded, and both boards are laminated in a manner to bond the expanded electrode and the antenna electrode, both electrodes can be registered easily each other despite the IC chip size reduction and miniaturization and, consequently, the increase of manufacturing cost (mainly packaging cost) of noncontact ID card or the like can be prevented.

In case of interposing insulating adhesive agent between both substrates, both boards may be laminated after an adhesive agent application step for applying insulating adhesive agent to the interposer board, which have been through the electrode formation step, in a way to coat an electrode formation portion of the IC chip. Besides, the expanded electrode can be formed easily by the screen printing method.

BRIEF DESCRIPTION OF DRAWINGS

FIG. 14 shows a configuration a manufacturing apparatus of noncontact ID card or the like;

FIG. 16 shows a bonding mode of a conventional noncontact ID card or the like.

DETAILED DESCRIPTION OF THE PREFERRED EMBODIMENTS

Hereinafter, the present invention shall be described in detail referring to the attached drawings.

Figure 1:
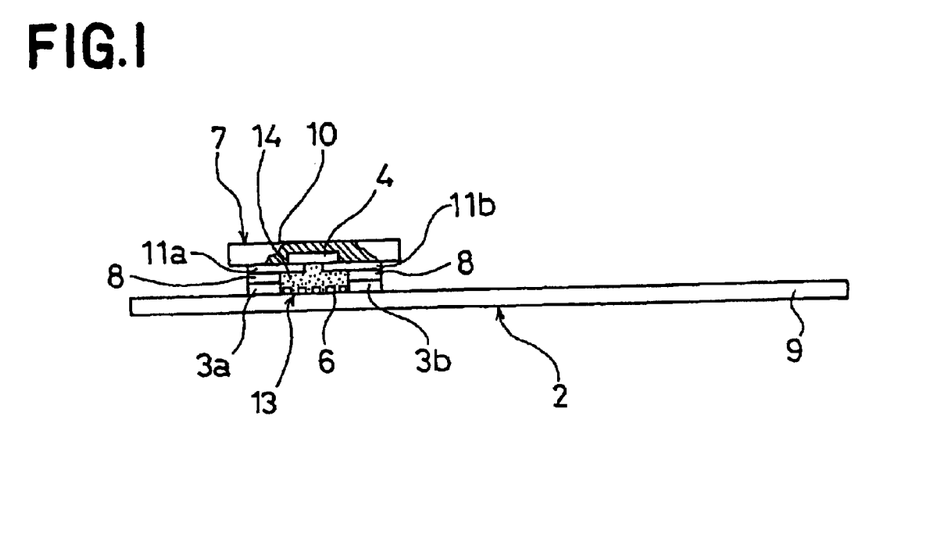
FIG. 1 is a front view showing a board lamination mode of a noncontact ID card or the like of the present invention.
Figure 2:
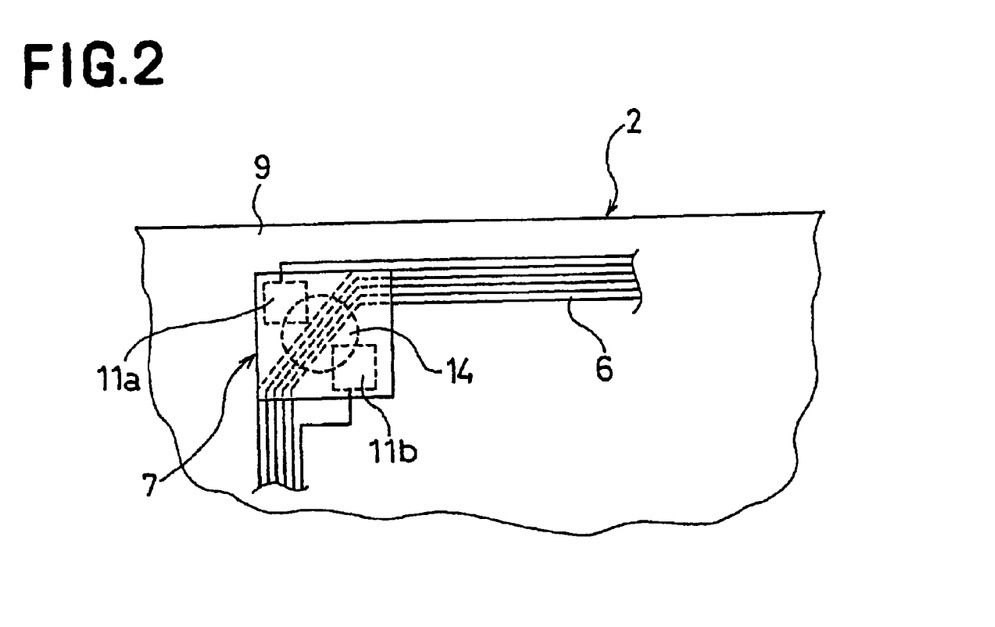
FIG. 2 is a plan view of FIG. 1.

In the present invention, a noncontact ID card or the like is composed by laminating an antenna circuit board and an interposer board. The image is shown by FIG. 1 which is a front view and, at the same time, an plan view image thereof is shown in FIG. 2. In both drawings, an underside antenna circuit board 2 and an upside interposer board 7 are bound in a conductive state through an electrically conductive adhesive agent 8.

And, the antenna circuit board 2 forms an antenna 6 and a pair of antenna electrodes 3a, 3b connected to the same (refer to FIG. 17), on a substrate 9 composed of resin film. On the other hand, the interposer board 7 holds an IC chip 4 embedded on a substrate 10 composed of resin film, and moreover, forms expanded electrodes 11a, 11b connected to a pair of electrodes of the IC chip 4.

Figure 3:
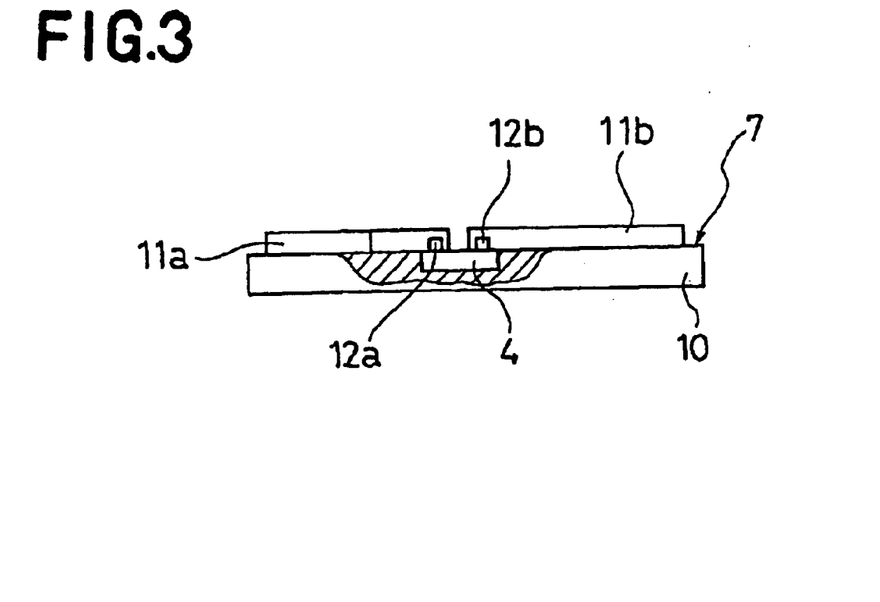
FIG. 3 is a front view of an interposer board.
Figure 4:
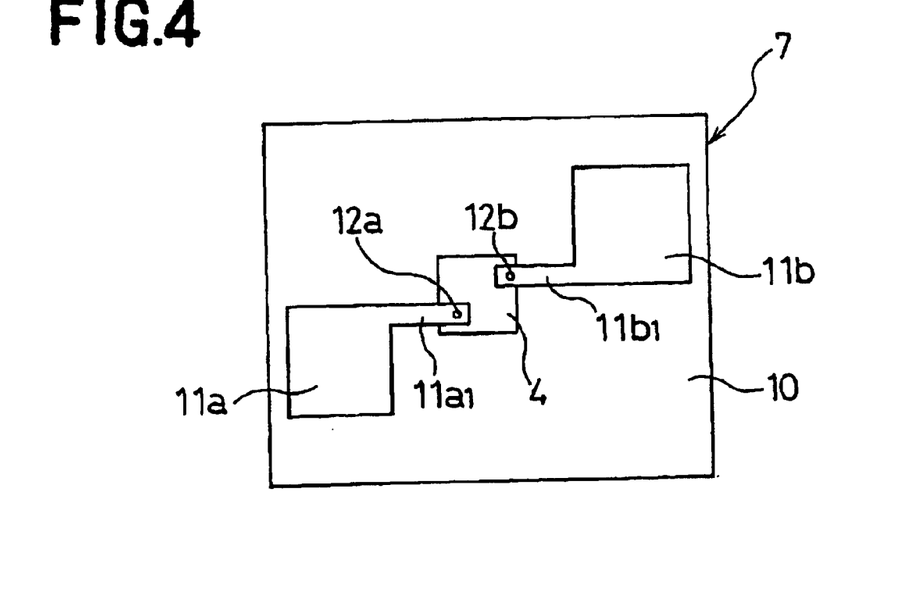
FIG. 4 is a plan view of FIG. 3.

It should be noted that an enlarged image of the interposer board 7 is shown in FIGS. 3, 4 and, in both drawings, the pair of electrodes 12a, 12b of the IC chip 4 are, for instance, aluminum electrodes, and they are connected to fine lead portions $11a_1$, $11b_1$ of the expanded electrodes 11a, 11b. Thus, the interposer board 7 forms the expanded electrodes 11a, 11b connected to the electrodes 12a, 12b of the IC chip 4, on a substrate 10 where the IC chip 4 is embedded.

As a result, in case of laminating the interposer board 7 in the conductive state in respect to the antenna circuit board 2, the expanded electrodes 11a, 11b can be registered easily in respect to the antenna electrodes 3a, 3b. And, based on this fact, the assembly operation of the noncontact ID card or the like can be performed by hands, for instance, by an operator who laminates by holding the interposer board 7 using an appropriate tool, or an operator who laminates by grasping the interposer board 7, directly with his/her hands. Consequently, it can be planned to prevent the increase of manufacturing cost (mainly packaging cost), despite the IC chip size reduction and miniaturization.

It should be appreciated that the electrically conductive adhesive agent 8 for bonding the antenna circuit board 2 and the interposer board 7 in the conductive state is the one presenting adhesivity or stickiness, may be either paste form one or tape form one, and also, may be either anisotropic one or isotropic one. By using the one presenting the stickiness, the interposer board 7 laminated (packaged) on the antenna circuit board 2 can be removed easily as necessary.

The aforementioned adhesive agent 8 is applied to or put on the antenna electrodes 3a, 3b of the antenna circuit board 2 or the expanded electrodes 11a, 11b of the interposer board 7, before laminating both boards. In general, it is applied to or put on the antenna electrodes 3a, 3b of the antenna circuit board 2.

Also, in addition to the application or putting of the electrically conductive adhesive agent 8, it is preferable to fill a sealing portion 13 (refer to FIG. 1) between the substrate 9 of the antenna circuit board 2 and the substrate 10 of the interposer board 7 with insulating adhesive agent 14 so as to seal an antenna formation portion of the antenna circuit board 2 and an electrode formation portion of the IC chip 4, thereby, it can be planned to reinforce the bonding between the interposer board 7 and the antenna circuit board 2 together with the short-circuit prevention, and therefore, the electric bonding state of the expanded electrodes 11a, 11b and the antenna electrodes 3a, 3b can be kept satisfactory (in the conductive state).

The insulating adhesive agent 14 also, similarly to the electrically conductive adhesive agent 8, is the one presenting adhesivity or stickiness, and may be either paste form one or tape form one.

Besides, the expanded electrodes 11a, 11b and the antenna 6 are preferably formed by a printing method, for instance, screen printing method, from the aspect of cost reduction. Howsoever, they may be formed by another printing method, for instance, offset printing or others as necessary, and furthermore, by other method than the printing method, for instance, sputtering method or the like.

As for electrically conductive adhesive agent 8 and insulating adhesive agent 14, in general, thermosetting ones are used; however, the others, for example, those of normal temperature setting type or others may also be used, and in case of using the former, the same is heat fixed in a predetermined process of the manufacturing.

It is preferable that electrodes 12a, 12b of the IC chip 4 have an under barrier metal layer (called UBM layer, hereinafter) that can ensure the connection with the expanded electrodes 11a, 11b.

Figure 5:
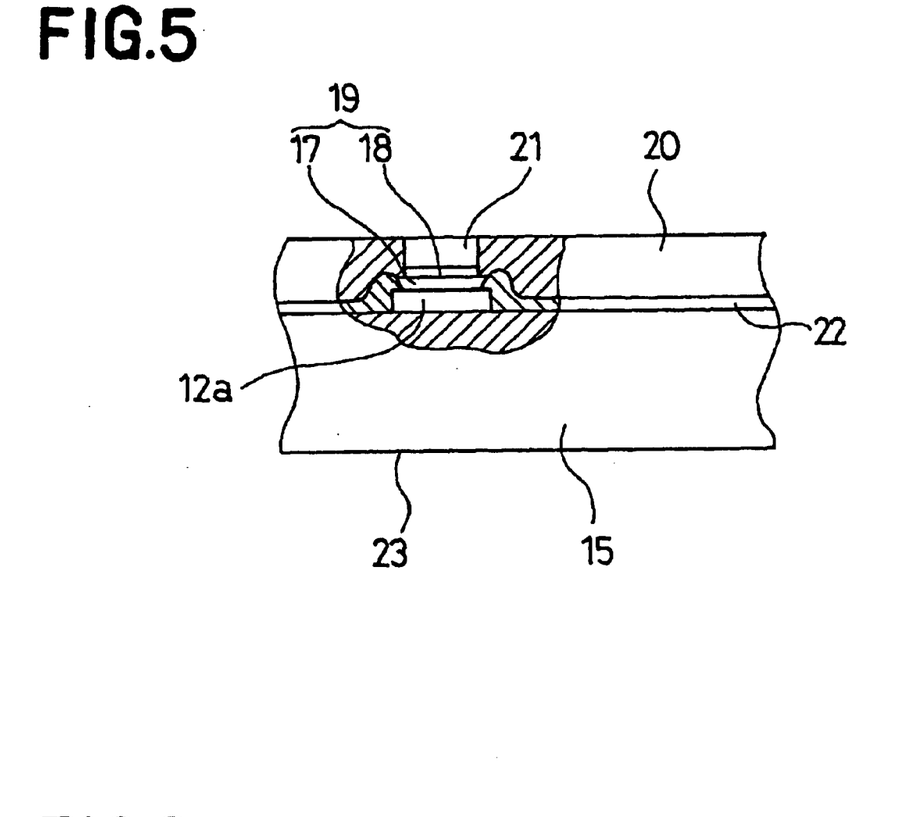
FIG. 5 shows a wafer where an IC circuit is formed.

The aforementioned IC chip 4 can be manufactured as follows. In FIG. 5, first, a wafer 15 where an IC circuit for noncontact ID card or the like is formed on the top face is prepared, and a glass passivation film 22 (oxide film) is removed by etching selectively with a weakly acid liquid so that the electrodes 12a, 12b (for instance, aluminum electrode) of the circuit be exposed.

Then, after the activation treatment, it is soaked, for instance, in an electroless nickel cell of 90° C. for 20 minutes for forming a nickelled layer 17 of about 3 µm exclusively on the aluminum electrodes 12a, 12b and, following this, it is soaked in an electroless gold plating cell of 90° C. for 10 minutes for forming a gold plated layer 18 of about 0.1 µm on the nickelled layer 17.

Thus formed nickelled layer 17 and gold plated layer 18 prevents the aluminum electrodes 12a, 12b from deterioration, and furthermore, ensures the connection between the aluminum electrodes 12a, 12b and external terminals. This is an UBM layer 19.

Next, using a screen printer, a solder resist 20 is printed all over the top face of the wafer 15 except for the aluminum electrodes 12a, 12b, then heated and set using an oven for forming, for instance, an insulation layer of 20 µm in thickness. It should be appreciated that heat setting type polyimide ink or the like are also effective in place of solder resist.

Next, using a screen printer, a conductive paste 21 wherein silver particles are dispersed is printed and charged into an opening portion (portion where the solder resist 20 is not printed) of the aluminum electrodes 12a, 12b, and the same is heat set.

Figure 6:
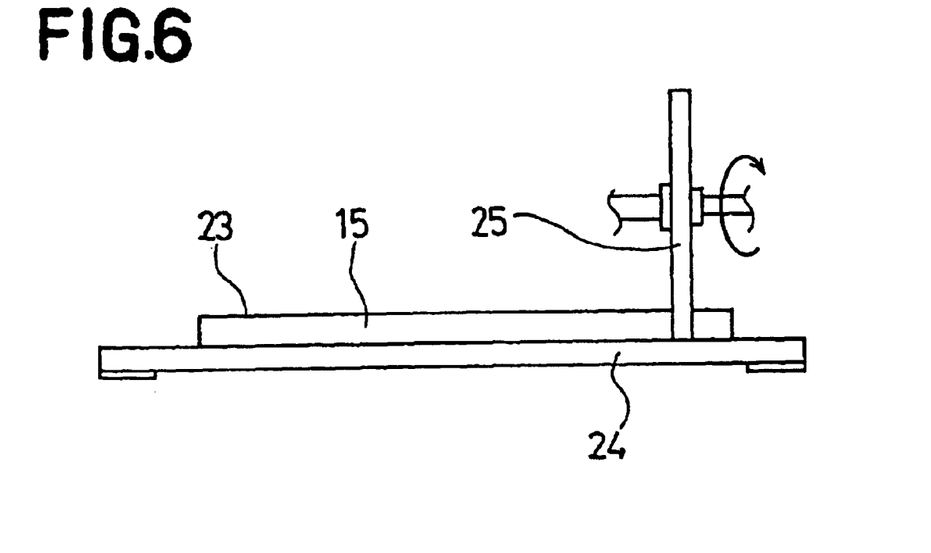
FIG. 6 shows a dicing cut mode of the wafer.

Next, a lower face 23 (face where the IC circuit for noncontact ID card or the like is not formed) of such wafer 15 is polished, the thickness thereof is processed, for instance, to 50 µm and, thereafter, as shown in FIG. 6, the top face (face where the IC circuit for noncontact ID card or the like is formed) of the wafer 15 is affixed to a support film 24, then, the wafer 15 is dicing cut to a predetermined size (for example, 1.6 mm×2.0 mm) by turning a diamond blade 25, the IC chip 4 obtained by this is removed from the support film 24, and it may be arranged in a pallet created by nickel electromolding.

The IC chip 4 may well be manufactured by the other methods different from the aforementioned method and, by these methods, for instance, a rectangular IC chip 4 having, for instance, a size of 1.2 mm×1.6 mm, and wherein square aluminum electrodes 12a, 12b of 100 µm one side are formed at the opposite angle positions thereof, can be obtained. Here, an IC chip 4 having tapered side walls may well be obtained by setting the tip of a diamond blade 25 in V-shape, and dicing cutting the wafer 15 by the same.

Figure 7:
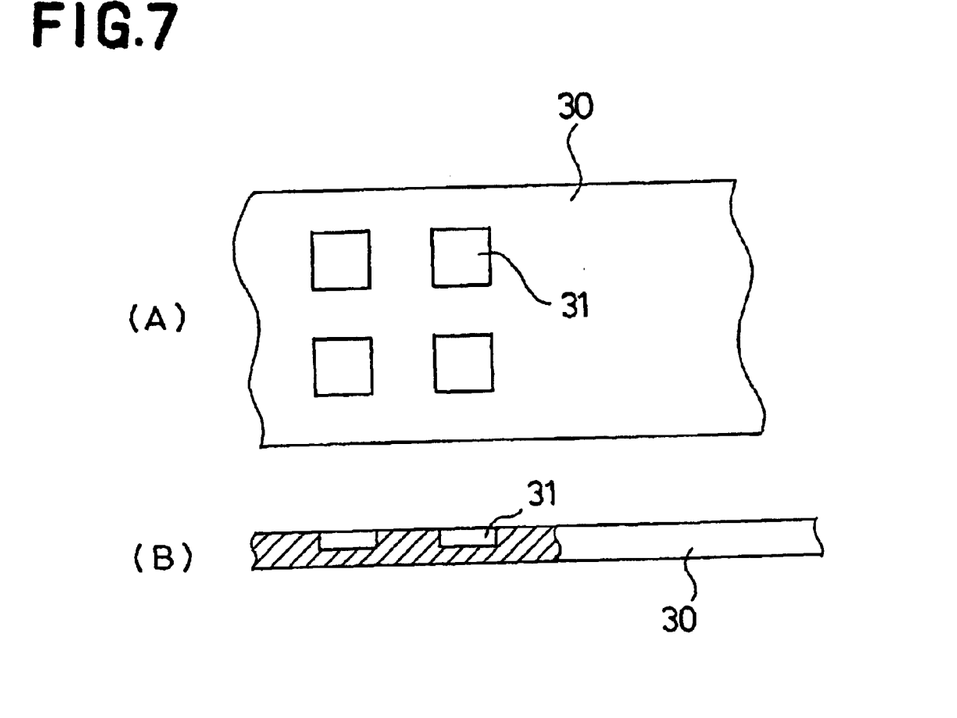
FIG. 7 shows a raw material for manufacturing the interposer board, (a) is a plan view, and (B) a front view.

As also for the interposer board 7, for instance, it can be manufactured as follows. First, a raw material 30 made of a resin film (for example, polyester base alloy film of 100 µm in thickness) having a large width, in short, a web form shown by FIG. 1(A) which is a plan view is prepared, and a plurality of chip embedding holes 31 are processed thereon in a predetermined pattern.

For instance, a nickel die having a plurality of bumps formed similar to the IC chip 4 is heated to 240° C., applied to the resin film 30, pressed for 10 seconds, quenched, cooled down to 80° C. and extracted, for processing chip embedding holes 31 with hole pitch of 10 mm in length and breadth, opening portion of 1.2 mm×1.6 mm and depth of 50 µm (refer to FIG. 7(B)).

It should be appreciated that the processing method of the chip embedding holes 31 may be laser abrasion method, plasma etching method, chemical etching method or others. However, the aforementioned press method is preferable as it presents the best productivity.

Such raw material 30 is not limited to those of the aforementioned non laminated type, but may be those of laminated type. For example, it may be a raw material of two-layered structure laminating a first raw material composed of resin film and a second raw material composed of resin film or metal foil. In case of raw material of the two-layered structure, it is preferable to laminate the first raw material perforated with chip embedding holes 31 on the second raw material, in view of the easiness of hole processing.

Figure 8:
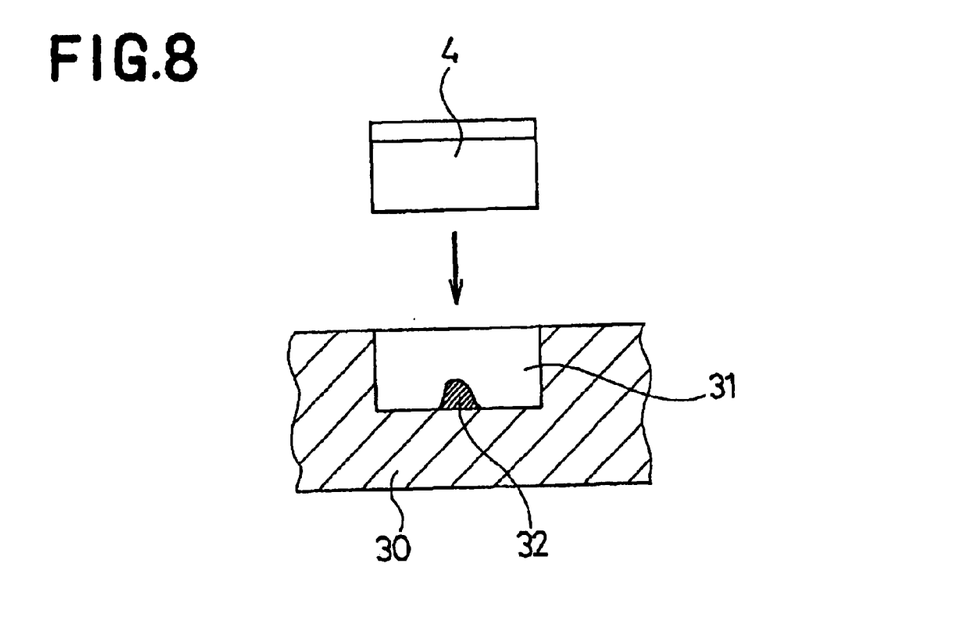
FIG. 8 shows a mode for inserting an IC chip into a chip embedding hole.

Next, the IC chip 4 is inserted and fixed into the chip embedding hole 31 of the raw material 30. At this moment, for instance, as shown in FIG. 8, it is preferable to transfer a trace of low viscosity epoxy base resin 32 to the bottom of the chip embedding holes 31 using a transfer pin, and then insert the IC chip 4.

The IC chip 4 inserted into the chip embedding hole 31 from an end where the aluminum electrodes 12a, 12b are not provided, and moreover, the inserted IC chip 4 is temporarily fixed with resin 32. Thereafter, a gap between the side face of the IC chip 4 and the side face of the chip embedding hole 31 is filled with adhesive and fixed.

However, the IC chip 4 may be inserted after having applied adhesive to the bottom and side wall of the chip embedding hole 31. Besides, it is preferable to perforate the bottom of the chip embedding hole 31 with a bleed hole for venting during the heat setting of the adhesive.

Thus, the IC chip 4 can be embedded in the raw material 30 to make an appearance exposing only the aluminum electrodes 12a, 12b. In the embedding, the transfer of the IC chip 4 may be held, for instance, with the help of a (not shown) nozzle of 1.5 mm in outer diameter having a air suction port of 0.5 mm at the middle portion, for sucking and taking out the IC chip 4 from the alignment pallet, and inserting into the chip embedding hole 31 of the raw material 30.

In addition, in case where an IC chip 4 having tapered side walls as mentioned above is obtained, the insertion of the IC chip 4 into the chip embedding hole 31 can be simplified furthermore. In short, as the IC chip 4 has a surface protected with an insulating layer, it can be treated as bulk similarly to general electronic components. There, the IC chip 4 can be delivered on the raw material 30 where a number of chip embedding holes 31 having tapered side faces, and the IC chip 4 can be inserted into the chip embedding hole 31 by ultrasonic vibration to the raw material 30. In this case, the productivity of interposer board can be increased by leaps and bounds, because the IC chip 4 can be embedded smoothly, by tapering the side wall.

Next, the expanded electrodes 11a, 11b connected to the aluminum electrodes 12a, 12b of the IC chip 4 are formed. They are formed by printing conductive paste where, for example, silver particles are dispersed by about 70% using a screen printer, on a face where the aluminum electrodes 12a, 12b of the IC chip 4 embedded in the raw material 30 are exposed. The conductive paste is identical to the aforementioned conductive paste 21 (refer to FIG. 5).

For instance, expanded electrodes 11a, 11b of about 15 µm in thickness, 0.2 mm in breadth of lead portions 11a$_1$, 11b$_1$, 3 mm square in size of the enlarged portion and 8 mm in pitch of one enlarged portion and the other enlarged portion.

Then, the interposer board 7 can be obtained by stamping out in a predetermined size from the raw material 30 where the expanded electrodes 11a, 11b are formed. For instance, it is stamped out in a size of 10 mm square. A part of the interposer board 7 obtained in this manner is shown by enlarging in FIG. 9. It should be appreciated that the substrate 10 of the interposer board 7 is homogenous as the raw material 30, as evident from the foregoing.

On the other hand, the antenna circuit board 2 can be manufactured as follows. In general, a raw material of the same nature as the aforementioned raw material 30 (for instance, polyester alloy film of 100 μm in thickness) is selected. Such raw material is not provided with chip embedding hole 31 and the width thereof is processed to a predetermined size.

Such raw material is transferred intermittently by reel-to-reel method, silver paste is screen printed to the same, and antenna circuits (antenna 6 and antenna electrodes 3a, 3b) are formed successively with a constant interval.

Then, it can be manufactured by stamping out into a predetermined size in a subsequent process, in short, by stamping out into the unit size of the substrate 9. Here, the process for stamping out in the unit size of the substrate 9 may be performed after packaging (bonding) the interposer board 7 where the expanded electrodes 11a, 11b are formed to the raw material where the antenna 6 and the antenna electrodes 3a, 3b are formed.

Figure 17:
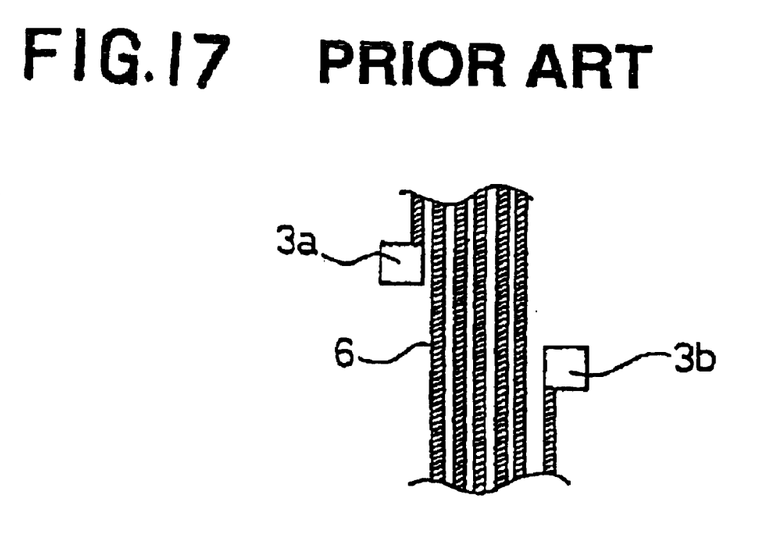
FIG. 17 is a plan view of an antenna formation portion of FIG. 16.

In this manner, for instance, the antenna 6 of 0.25 mm in wiring width, 0.5 mm in pitch thereof, 6 turns in number of turns, and 75 mm×45 mm in outermost periphery can be formed and, at the same time, the antenna electrodes 3a, 3b of 3 mm square in size and 8 mm in pitch can be formed at both ends of the antenna 6 (refer to FIG. 17).

The substrate 9 of the antenna circuit board 2 is not limited to those of the aforementioned non laminated type, but may be those of laminated type. For example, it may be those of two-layered structure laminating a first raw material composed of resin film and a second raw material composed of resin film or metal foil (for instance, aluminum foil).

In the following, the interposer board 7 is laminated on the obtained antenna circuit board 2. At this moment, as the expanded electrodes 11a, 11b are formed on the interposer board 2, both boards can be stacked by easily positioning the expanded electrodes 11a, 11b on the antenna electrodes 3a, 3b of the antenna circuit board 2, by hands.

Before such lamination, for instance, electrically conductive adhesive agent 8 is applied to the antenna electrodes 3a, 3b and, at the same time, the sealing portion 13 (refer to FIG. 1) is filled with insulating adhesive agent 14. Then, after the lamination, the conductive adhesive agent 8 and the insulating adhesive agent 14 are heat set, for instance, heated at 90° C. for 5 minutes and set for fixing (bonding) the both.

The lamination by the aforementioned manual operation may well be performed with in a range of ±1.0 mm to ±1.5 mm in lamination accuracy, and the noncontact ID card or the like can be obtained in this manner. The noncontact ID card or the like is a so-called inlet, which is cladded conveniently to make a commercialized product.

Figure 10:
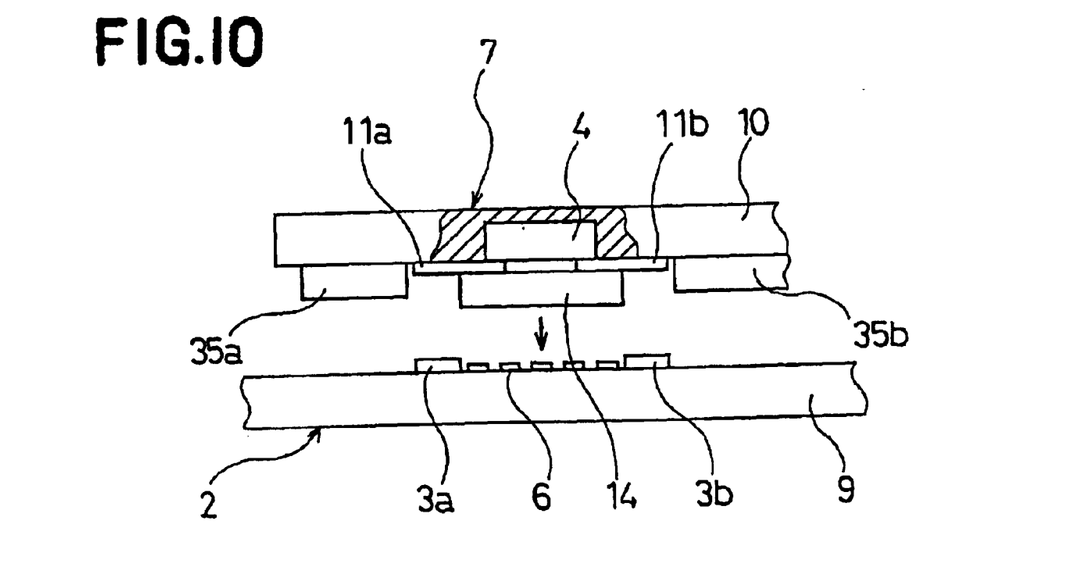
FIG. 10 is a front view showing another board lamination mode of a noncontact ID card or the like of the present invention.

In the present invention, the interposer board 7 can also be laminated in respect to the antenna circuit board 2 as shown in FIG. 10. In the same drawing, an image for adhering the interposer board 7 to the antenna circuit board 2 is shown, and the insulating adhesive agent 14 and non insulating adhesive agent 35a, 35b are affixed to the substrate 10 of the interposer board 7.

It should be appreciated that the insulating adhesive agent 14 is composed of insulating adhesive tape and, at the same time, the adhesive agent 35a, 35b are composed of pressure-sensitive adhesive tape. These insulating adhesive tape and pressure-sensitive adhesive tape are both double faced tapes.

Consequently, both substrates can be glued to each other easily by applying the interposer board 7 to the substrate 9 of the antenna circuit board 2 and, furthermore, the antenna electrodes 3a, 3b of the antenna circuit board 2 and the expanded electrodes 11a, 11b of the interposer board 7 can be bonded in conductive state by making them into contact, directly.

In the foregoing, the insulating adhesive agent 14 and adhesive agent 35a, 35b are affixed to the interposer board 7 side; however, the insulating adhesive agent 14 may be affixed to the interposer board 7 side and, at the same time, the adhesive agent 35a, 35b may be affixed to the antenna circuit board 2 side.

Also, the insulating adhesive agent 14 may be affixed to the antenna circuit board 2 side and, at the same time, the adhesive agent 35a, 35b may be affixed to the antenna circuit board 2 side. However, it is most preferable to affix the both to the interposer board 7 side in view of lamination by a simple movement.

It should be appreciated that the insulating adhesive agent 14 and adhesive agent 35a, 35b may be those of paste form; however, as it is easier to affix those of tape form than to apply the same, it is preferable to select this.

And, as for the adhesive agent 35a, 35b, in general, those of pressure sensitive type are used; however, thermosetting ones or others, for instance, those of normal temperature setting type and so on may also be used and, in case of using those of thermosetting type, the heat fixation is performed in a predetermined process of the manufacturing. Furthermore, if necessary, conductive adhesive agent 8 may be applied or affixed to the antenna electrodes 3a, 3b or expanded electrodes 11a, 11b.

Figure 9:
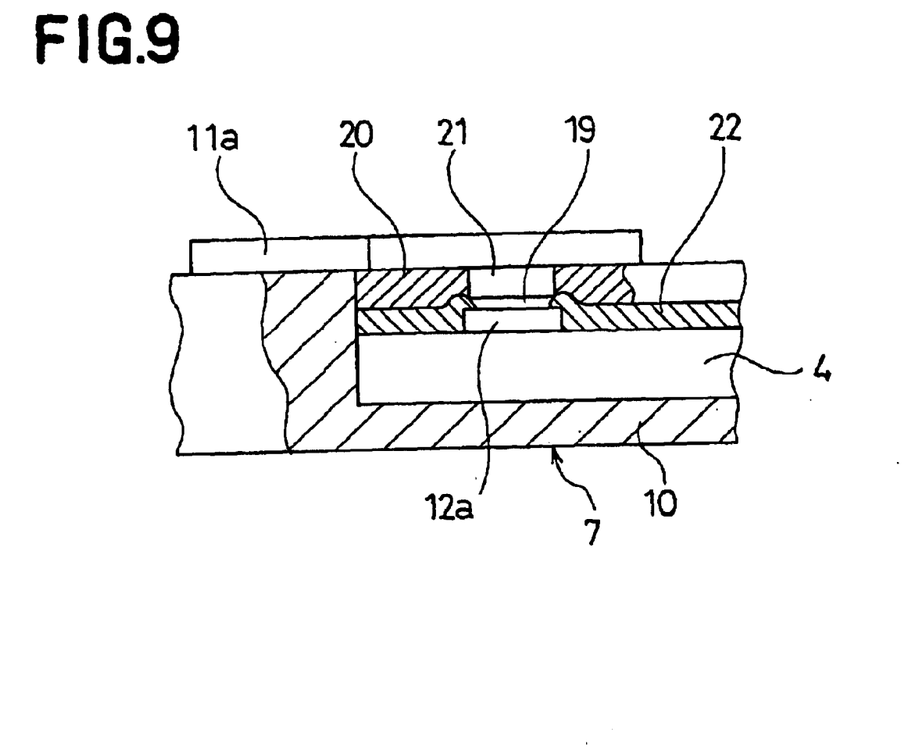
FIG. 9 is an enlarged view of essential parts of the interposer board.

The interposer board 7 according to the present invention is not limited to the one shown in the aforementioned FIG. 9, but it may well be the one configured in the other mode.

Figure 11:
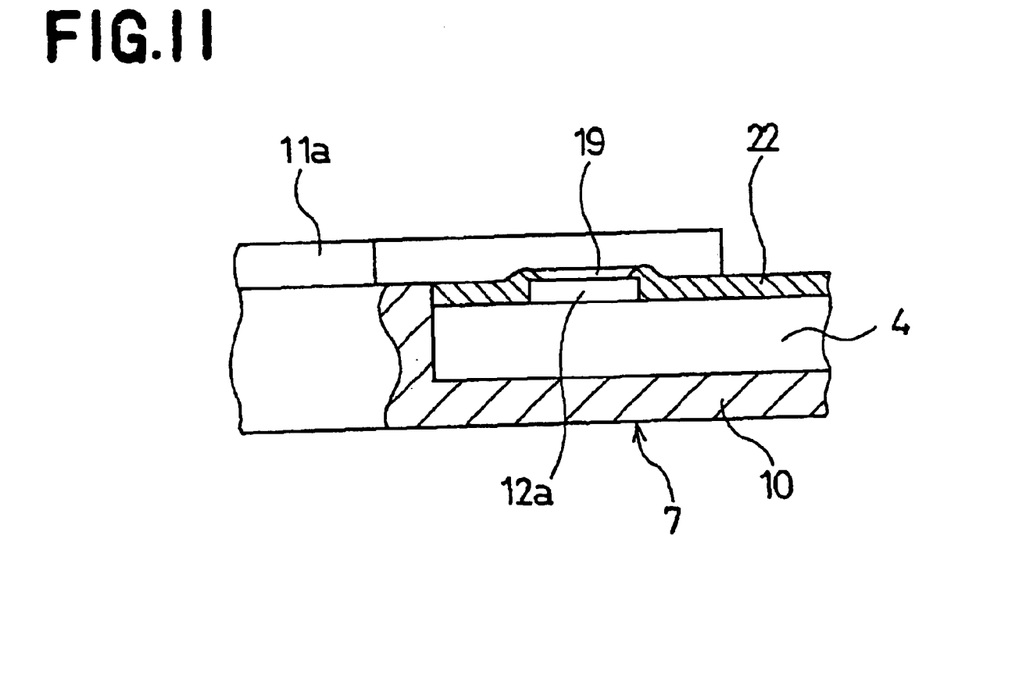
FIG. 11 shows another example of the interposer board.

For example, as shown in FIG. 11, it may be the one using a glass passivation film 22 coated on the portion other than the electrode of a wafer 15 as it is as insulating layer of the wafer surface, and forming the expanded electrodes 11a, 11b on the substrate 10 of the interposer board 7 wherein an IC chip 4 having the glass passivation film 22 as insulation layer is embedded.

Figure 12:
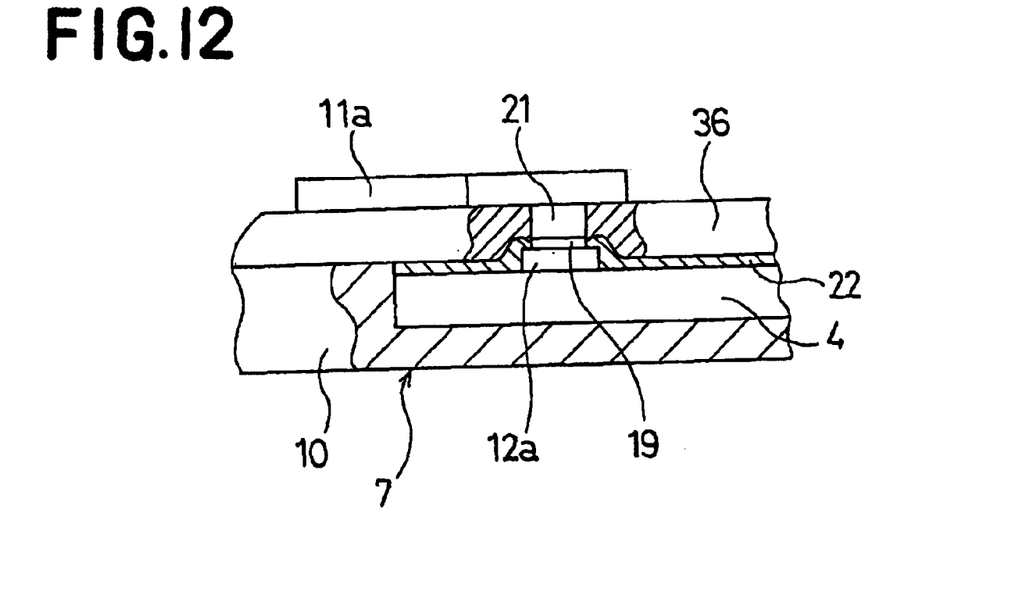
FIG. 12 shows still another example of the interposer board.

Also, as shown in FIG. 12, it may be the one wherein a photosensitive epoxy resin layer 36 is formed in a way to open only the electrodes 12a, 12b portions on the substrate 10 of the interposer board 7 wherein the IC chip 4 having the glass passivation film 22 as insulation layer is embedded and, at the same time, the expanded electrodes 11a, 11b are formed on the photosensitive epoxy resin layer 36. Furthermore, it may be the one wherein a solder resist 20 is formed in place of the aforementioned photosensitive epoxy resin layer 36.

Such photosensitive epoxy resin layer 36 or solder resist 20 in place thereof may be formed by impressing to a predetermined thickness using a screen printer, after having inserted and fixed the IC chip 4 into the chip embedding hole 31 of the raw material 30, and, consecutively, an interposer board 7 of the structure shown in FIG. 12 can be manufactured by stamping out the raw material 30 by unit size of the substrate 10 after having formed the expanded electrodes 11a, 11b on the photosensitive epoxy resin layer 36 or solder resist 20 formed in this way.

Note that the interposer board 7 of FIG. 9 and FIG. 12 which protects the IC chip 4 with the solder resist 20 or epoxy resin layer 36 is more resistant to the thermal effect and easier to handle than the interposer board 7 of FIG. 11 wherein they are not formed.

Besides, in the comparison of the interposer board 7 of FIG. 9 and that of FIG. 12, a gap (difference in level) appears easily between the top face of the substrate 10 (face where the expanded electrodes 11a, 11b are formed) and the top face of the solder resist 20, in the former, while it does not appear, in the latter; therefore, the latter is more advantageous for forming the expanded electrodes 11a, 11b thereon.

Concerning also the formation of such expanded electrodes 11a, 11b, the formation is not limited to the aforementioned screen printing method, but they may be formed by another method. For instance, the expanded electrodes 11a, 11b can be formed by forming a metal film by aluminum sputtering whole (all over) the face where the aluminum electrodes 12a, 12b of the IC chip 4 embedded on the substrate 30 are exposed, then, applying resist all over the metal film, after drying the same, forming a resist pattern mask by exposure and development, and consecutively, removing aluminum of the mask opening portion by means of aluminum etching liquid.

Moreover, the expanded electrodes 11a, 11b and antenna electrodes 3a, 3b may be other material as necessary, and their shape, size, thickness and so on are decided conveniently.

Also, the IC chip manufacturing method may well be the other method. For example, the aforementioned wafer 15 where the IC circuit for noncontact ID card or the like is formed on the top is used, and polished to a predetermined thickness (say, 50 μm), a photo resist is applied and dried, thereafter, only portions of the aluminum electrodes 12a, 12b are exposed to the light using a photo mask and developed, and only the aluminum electrodes 12a, 12b are exposed by removing photo resist thereof.

Then, the wafer 15 is processed with plasma, oxide film on the surface of the aluminum electrode 12 is removed, thereafter, a titan tungsten layer of a predetermined thickness (say, 0.5 μm) is formed by sputtering, and then, a gold layer of a predetermined thickness (say, 0.05 μm) is formed on such titan tungsten layer and, at last, the photo resist is peeled off. The titan tungsten layer and the gold layer form the UBM layer 19.

Following this, the wafer 15 is dicing cut to a predetermined size by turning a diamond blade, and the IC chip 4 obtained by this may be taken out from a support film 24.

Also, for the lamination of the antenna circuit board 2 and the interposer board 7, in general, the interposer board 7 is laminated from upside on the underside antenna circuit board 2; however, the interposer board 7 may be bounded from the underside to the upside antenna circuit board 2.

At this moment, it can be planned to make the lamination or bonding accuracy constant, for example, by providing a L-shape mark on the antenna circuit board 2, or installing a guide pin, as means for positioning the interposer board 7 in respect to the antenna circuit board 2.

Figure 13:
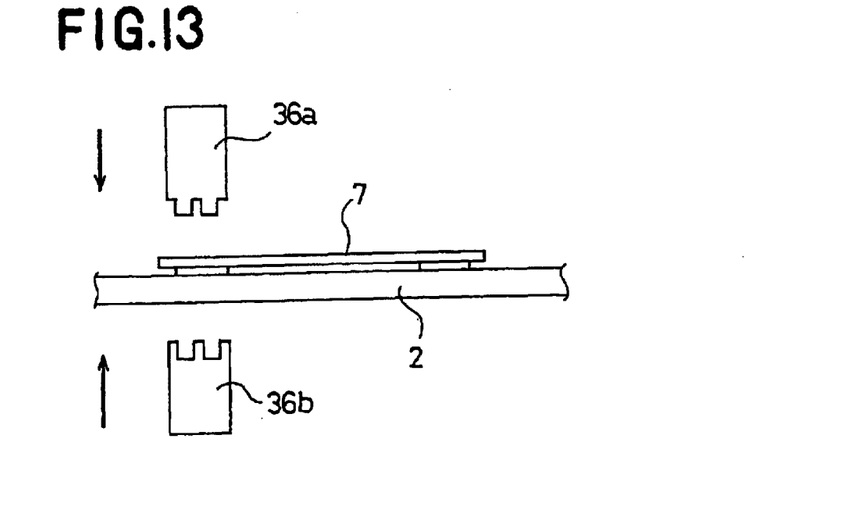
FIG. 13 shows a mode for compressing laminated antenna circuit board and interposer board.

In addition, it can be planned to reinforce the bonding by compressing the laminated both boards 2, 7 with a pair of upper and lower calking tools 36a, 36b, as shown in FIG. 13. The noncontact ID card can be assembled by applying normal temperature instantaneous setting type insulating adhesive to the affixing position of the interposer board 7 in respect to the antenna circuit board 2, affixing the interposer board 7 thereto, and thereafter, pressing electrodes each other using the calking tools 36a, 36b. For example, if an antenna circuit is formed beforehand on the form of the freight or others, the interposer board can be affixed as necessary. Dimensions and the material quality of the antenna circuit board where the antenna circuit is formed can be selected arbitrarily. Also, a tape form interposer board may be wound up on a reel, paid out and cut as necessary similarly to the tag for bar code, and affixed to the antenna circuit board.

Figure 14:
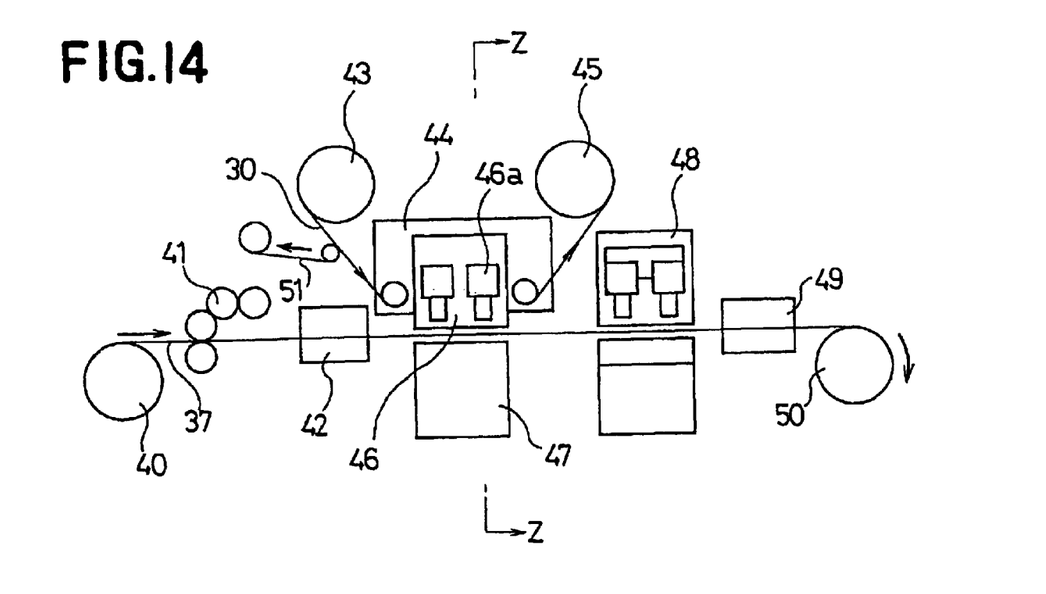

In the present invention, as mentioned above, both electrodes can be registered each other simply despite the IC chip size reduction and miniaturization, because both boards are laminated in a way to bond the electrodes 12a, 12b of the IC chip 4 and the electrodes 3a, 3b of the antenna 6 through the expanded electrodes 11a, 11b and, consequently, noncontact ID card or the like such as noncontact ID card or noncontact tag, and so on can be manufactured by manual operation; however, they can also be manufactured using an apparatus shown in FIG. 14.

The manufacturing apparatus comprises an antenna circuit board raw material let-off gear 40, an antenna circuit printer 41, an oven 42, an interposer board raw material let-off gear 43, a press cut apparatus 44, a remaining raw material winder 45, an interposer board temporary affixer 46, an interposer board transfer apparatus 47, an interposer board final affixer 48, a dryer 49, and a product winder 50.

In the manufacturing apparatus, the antenna circuit (antenna 6 and electrodes 3a, 3b) are printed by the antenna circuit printer 41 on a raw material 37 delivered from the antenna circuit board raw material let-off gear 40 and, then, heated in the oven 42 to fix the antenna circuit. In parallel with this, a raw material 30 delivered from the interposer board raw material let-off gear 43 is stamped out by the press cut apparatus 44 to obtain the interposer board 7 of a predetermined size, and at the same time, the remaining raw material 30 after the stamping of the interposer board 7 is taken up by the remaining raw material winder 45.

The interposer board 7 stamped out from the raw material 30 is held by the interposer board transfer apparatus 47 and transferred to the adhesion point (laminating position), in short, transferred above the antenna circuit formed on the top face of the raw material 37. At this moment, the positioning in respect to the antenna circuit formed on the raw material 37 can be performed easily, as the expanded electrodes 11a, 11b are formed on the interposer board 7.

It should be appreciated that the raw material 30 delivered from the interposer board raw material let-off gear 43 is the one where the IC chip 4 is embedded and the expanded electrodes 11a, 11b are formed and, at the same time, the insulating adhesive agent 14 and the adhesive agents 35a, 35b are affixed (refer to FIG. 10) and, furthermore, the adhesion surface thereof is protected with a protection tape 51. This is wound up on a reel in a former process beforehand, and set on the interposer board raw material let-off gear 43. In addition, during the delivery of the raw material 30, the protection tape 51 is taken up and peeled off the raw material 30. Thereby, the adhesion face (bottom face side in FIG. 10) of the insulating adhesive agent 14 and the adhesive agents 35a, 35b are exposed.

Figure 15:
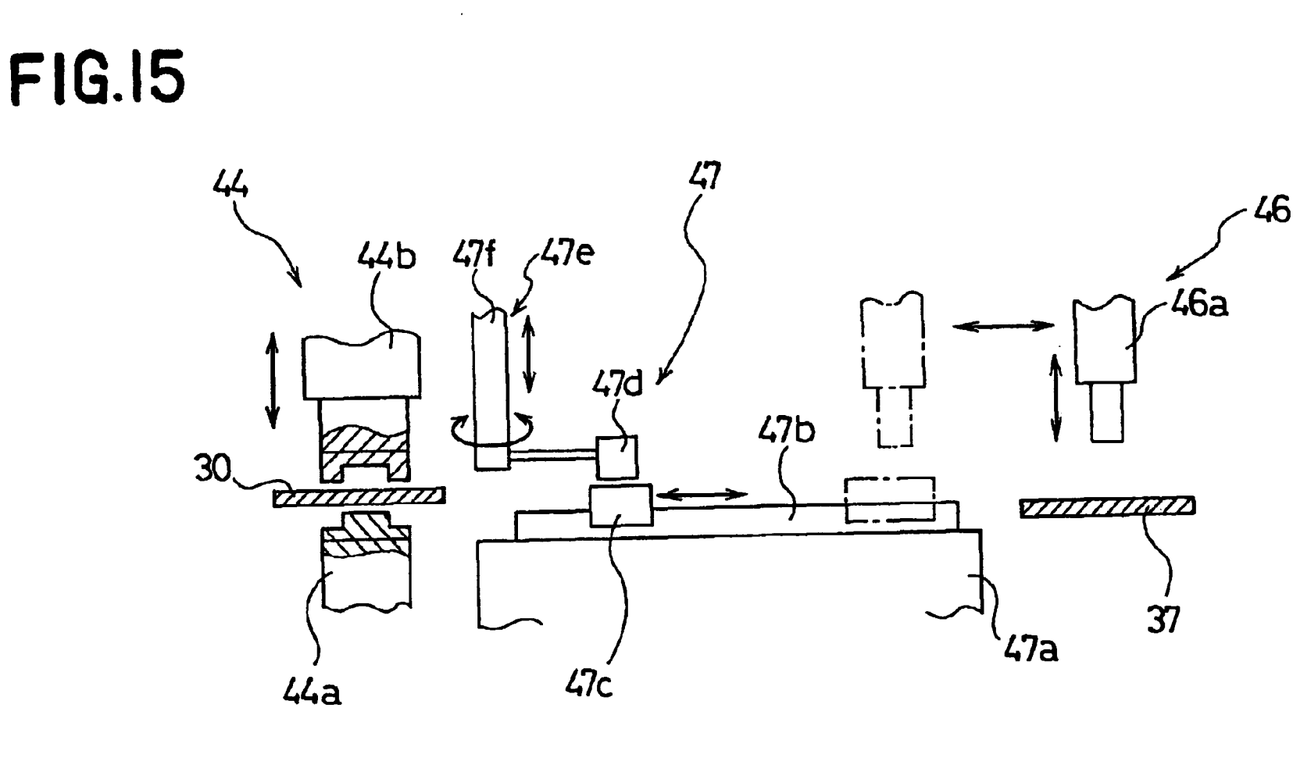
FIG. 15 is a view along Z—Z of FIG. 14.

In FIG. 15, a transfer mode of the interposer board 7 is shown, and in the same drawing, the interposer board transfer apparatus 47 comprises a slider with chuck 47c that can be guided by a rail 47b anchored to a machine base 47a and moved to the arrow direction shown in the drawing, and a suction band 47e for sucking and holding the interposer board 7 stamped out from the raw material 30 by means of an absorber 47d and delivering the same to the slider 47c.

For this purpose, when the slider with chuck 47c grasps the interposer board 7 with the chuck and moves to the point shown by a dotted line at the right side, a suction head 46a of the interposer board temporary affixer 46 moved above it moves downward to suck and hold the interposer board 7, and then, after having moved upward, moves furthermore above the raw material 37 at the right side. In this manner, the interposer board 7 can be transferred above the antenna circuit formed on the top face of the raw material 37, and, can be attached temporarily (bonded temporarily) by moving the suction head downward.

Here, the press cut apparatus 44 can stamp out the interposer board 7 from the raw material 30 by means of fixed side lower die 44a and movable side upper die 44b and, furthermore, the upper die 44b is moved upward upon completion of the stamping. Hereupon, a shaft arm 47f of the suction band 47e rotates and the absorber 47d is moved above the lower die 44a and, then, the shaft arm 47f is moved downward.

Consequently, the interposer board 7 stamped out from the raw material 30 can be sucked and held by the absorber 47d and, consecutively, the shaft arm 47f is moved upward and rotated at the same time, and the absorber 47 sucking and holding the interposer board 7 is moved on the slider with chuck 47c.

In the foregoing, the absorber 47d and the suction head 46a come into contact with the top face (face where the adhesive agent 35a, 35b and insulating adhesive agent 14 are not applied or affixed) of the raw material 10 shown in FIG. 10 to suck and hold the same, and, the chuck of the slider with chuck 47c grasps right and left ends (right and left ends where the adhesive agent 35a, 35b is not applied or affixed in FIG. 10) of the raw material 10.

It should be appreciated that the transfer of the raw material 30 is suspended during the stamping and transfer of the interposer board 7, and resumed upon completion thereof. Thus, the raw material 30 is transferred intermittently. On the other hand, the raw material 37 is transferred continuously with a predetermined rate. Besides, the projection of the lower die 44a and the cavity of the upper die 44b are composed of a material to which the adhesive agent 35a, 35b and insulating adhesive agent 14 adhere hardly.

Next, the interposer board 7 transferred above the adhesion point to the raw material 37 is attached temporarily (bonded temporarily) by the interposer board temporary affixer 46, in short, is attached temporarily through the insulating adhesive agent 14 and adhesive agent 35a, 35b, continuously, transferred to the interposer board final affixer 48, and finally affixed (finally bonded) by compression or the like, and furthermore, the insulating adhesive agent 14 and adhesive agent 35a, 35b are heat set by the dryer 49, and thereafter, the product is take up by the product winder 50.

It should be appreciated that the press cut apparatus 44, interposer board transfer apparatus 47, board temporary affixer 46 and interposer board final affixer 48 are configured into a multiple head type, in order to increase the manufacturing speed.

The aforementioned series of manufacturing lines makes a high precision bonder and so on unnecessary, and allows to manufacture the noncontact ID card or the like at a low cost and with a high speed.

INDUSTRIAL APPLICABILITY

As mentioned hereinabove, according to the present invention, with the use of an interposer board where an IC chip is embedded and expanded electrodes connected to electrodes of the IC chip are formed, the expanded electrodes can be registered easily in respect to the antenna electrodes of the antenna circuit board when the interposer board is laminated to the antenna circuit board in a conductive state. Therefore, the increase of manufacturing cost (mainly packaging cost) of noncontact ID card or the like can be prevented.

Moreover, in addition to the insulation of the predetermined point, the electric bonding state of the electrode of the IC chip and the antenna electrode of the antenna circuit board can be kept satisfactory (kept in the conductive state), even for the lamination structure of the antenna circuit board and the interposer board, by reinforcing the bonding of both boards by charging insulating adhesive agent in the sealing section between the antenna circuit board and the interposer board, and forming the under barrier metal layer (UBM layer) on the IC chip electrode.

What is claimed is:

1. A noncontact ID card, comprising:
   an antenna circuit board having an antenna circuit substrate and an antenna formed on the antenna circuit substrate; and
   an interposer board having an interposer substrate provided with a chip embedding hole, an IC chip inserted in the chip embedding hole and an expanded electrode formed on the interposer substrate, said expanded electrode having a primary terminal portion connected to an electrode of said IC chip and a secondary terminal portion integrally connected to the primary terminal portion,
   wherein both boards are laminated in a manner to bond an electrode of said antenna and the secondary terminal portion of said expanded electrode.

2. The noncontact ID card of claim 1, wherein said antenna electrode and said expanded electrode are bonded by an electric conductive adhesive agent.

3. The noncontact ID card of claim 1, wherein said antenna electrode and said expanded electrode are bonded directly, by gluing the substrate of said antenna circuit board and the substrate of said interposer board.

4. The noncontact ID card of claim 2 or claim 3, wherein an insulating adhesive agent is disposed between the substrate of said antenna circuit board and the substrate of said interposer board, in a way to seal an antenna formation section of said antenna circuit board and an electrode formation section of said IC chip.

5. The noncontact ID card of claim 4, wherein said IC chip electrode has an under barrier metal layer.

6. The noncontact ID card of claim 5, wherein the substrate of said interposer board and the substrate of said antenna circuit board are composed of a resin film.

7. The noncontact ID card of claim 1, wherein the primary terminal portion and the secondary terminal portion form a substantially plane surface.

8. The noncontact ID card of claim 7, wherein the secondary terminal portion includes a plane portion wider than the primary terminal portion.

9. The noncontact ID card of claim 1, wherein the IC chip has tapered side walls.

10. The noncontact ID card of claim 1, wherein the antenna circuit board and the interposer board are laminated by means of caulking.

11. The noncontact ID card of claim 1, wherein the expanded electrode is printed on the interposer substrate.

12. A manufacturing method of a noncontact ID card, comprising steps of:
    forming an antenna on an antenna circuit substrate to create an antenna circuit board having the antenna circuit substrate and the antenna;

forming a chip embedding hole on an interposer substrate;

inserting an IC chip in the chip embedding hole on the interposer substrate;

forming an expanded electrode on the interposer substrate to create an interposer board having the interposer substrate, the IC chip and the expanded electrode, the expanded electrode having a primary terminal portion connected to an electrode of the IC chip and a secondary terminal portion integrally connected to the primary terminal portion; and laminating the interposer board and the antenna circuit board in a way to bond an electrode of the antenna and the secondary terminal portion of the expanded electrode.

13. The manufacturing method of a noncontact ID card of claim 12, wherein both boards are laminated in a way to bond said antenna electrode and said expanded electrode with an electrically conductive adhesive agent.

14. The manufacturing method of a noncontact ID card of claim 12, wherein both boards are laminated in a way to bond directly said antenna electrode and said expanded electrode, by gluing the substrate of said antenna circuit board and the substrate of said interposer board.

15. The manufacturing method of a noncontact ID card of claim 13 or claim 14, wherein both boards are laminated after an adhesive agent application step for applying insulating adhesive agent to the interposer board, which have been through said electrode formation step, in a way to coat an electrode formation section of said IC chip.

16. The manufacturing method of a noncontact ID card of claim 15, wherein said expanded electrode is formed by the screen printing method.

17. The manufacturing method of a noncontact ID card of claim 12, wherein the primary terminal portion and the secondary terminal portion form a substantially plane surface.

18. The manufacturing method of a noncontact ID card of claim 17, wherein the secondary terminal portion includes a plane portion wider than the primary terminal portion.

19. The manufacturing method of a noncontact ID card of claim 12, wherein the IC chip has tapered side walls.

20. The manufacturing method of a noncontact ID card of claim 12, wherein the antenna circuit board and the interposer board are laminated by means of caulking.

21. The manufacturing method of a noncontact ID card of claim 12, wherein the expanded electrode is printed on the interposer substrate.

22. A manufacturing method of a noncontact ID card, comprising steps of:

forming a plurality of antennae on a antenna circuit board raw material including a plurality of antenna circuit substrates;

forming a plurality of chip embedding holes on an interposer board raw material including a plurality of interposer substrates;

inserting IC chips in the chip embedding holes on the interposer board raw material;

forming a plurality of expanded electrodes on the interposer board raw material, each of the expanded electrode having a primary terminal portion connected to an electrode of each of the IC chips and a secondary terminal portion integrally connected to the primary terminal portion;

cutting an interposer board off the interposer board raw material; and affixing the interposer board onto an antenna circuit board within the antenna circuit board raw material in a way to bond an electrode of the antenna and the secondary terminal portion of the expanded electrode.

23. A manufacturing method of a noncontact ID card, comprising steps of:

cutting an interposer board off an interposer board raw material, the interposer board raw material containing a plurality of interposer boards, each of the interposer boards having an interposer substrate provided with a chip embedding hole, an IC chip inserted in the chip embedding hole and an expanded electrode formed on the interposer substrate, the expanded electrode having a primary terminal portion connected to an electrode of the IC chip and a secondary terminal portion integrally connected to the primary terminal portion; and affixing the interposer board onto an antenna circuit board within an antenna circuit board raw material, the antenna circuit board raw material containing a plurality of antenna circuit boards, each of the antenna circuit boards having an antenna circuit substrate and an antenna formed on the antenna circuit substrate, the interposer board being affixed onto the antenna circuit board in a way to bond an electrode of the antenna and the secondary terminal portion of the expanded electrode.

24. The manufacturing method of a noncontact ID card of claim 23, wherein the antenna circuit board raw material and the interposer board raw material are supplied from respective let-off gears.

25. A manufacturing apparatus of a noncontact ID card, comprising:

a device for cutting an interposer board off an interposer board raw material, the interposer board raw material containing a plurality of interposer boards, each of the interposer boards having an interposer substrate provided with a chip embedding hole, an IC chip inserted in the chip embedding hole and an expanded electrode formed on the interposer substrate, the expanded electrode having a primary terminal portion connected to an electrode of the IC chip and a secondary terminal portion integrally connected to the primary terminal portion; and a device for affixing the interposer board onto an antenna circuit board within an antenna circuit board raw material, the antenna circuit board raw material containing a plurality of antenna circuit boards, each of the antenna circuit boards having an antenna circuit substrate and an antenna formed on the antenna circuit substrate, the interposer board being affixed onto the antenna circuit board in a way to bond an electrode of the antenna and the secondary terminal portion of the expanded electrode.

26. The manufacturing apparatus of a noncontact ID card of claim 25, further comprising:

a primary let-oft gear for supplying the antenna circuit board raw material; and a secondary let-off gear for supplying the interposer board raw material.

* * * * *